(12) United States Patent
Kil et al.

(10) Patent No.: US 8,092,862 B2
(45) Date of Patent: Jan. 10, 2012

(54) METHOD FOR FORMING DIELECTRIC FILM AND METHOD FOR FORMING CAPACITOR IN SEMICONDUCTOR DEVICE USING THE SAME

(75) Inventors: Deok Sin Kil, Ichon-shi (KR); Kwon Hong, Ichon-shi (KR); Seung Jin Yeom, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/895,678

(22) Filed: Sep. 30, 2010

(65) Prior Publication Data

US 2011/0027465 A1 Feb. 3, 2011

Related U.S. Application Data

(62) Division of application No. 11/722,680, filed on Jun. 22, 2007, now abandoned.

(30) Foreign Application Priority Data

Dec. 23, 2004 (KR) .................. 10-2004-0110920
Dec. 23, 2005 (WO) .............. PCT/KR2005/004508

(51) Int. Cl.
C23C 16/00 (2006.01)
(52) U.S. Cl. ...................... 427/248.1; 427/79
(58) Field of Classification Search .................. None
See application file for complete search history.

(56) References Cited

U.S. PATENT DOCUMENTS

| | | | |
|---|---|---|---|
| 5,418,388 | A | 5/1995 | Okudaira et al. |
| 6,407,435 | B1 | 6/2002 | Ma et al. |
| 6,570,253 | B1 | 5/2003 | Lim et al. |
| 6,596,602 | B2 | 7/2003 | Iizuka et al. |
| 6,627,503 | B2 | 9/2003 | Ma et al. |
| 6,660,660 | B2 | 12/2003 | Haukka et al. |
| 6,664,186 | B1 | 12/2003 | Callegari et al. |
| 6,754,108 | B2 | 6/2004 | Forbes |
| 6,774,050 | B2 | 8/2004 | Ahn et al. |
| 6,787,863 | B2 | 9/2004 | Nakajima |
| 6,797,525 | B2 | 9/2004 | Green et al. |

(Continued)

FOREIGN PATENT DOCUMENTS

JP 2001-267566 9/2001

(Continued)

OTHER PUBLICATIONS

Joo, M. S., IEEE Transactions on Electron Devices, vol. 50, No. 10, Oct. 2003.*

*Primary Examiner* — Bret Chen
*Assistant Examiner* — Joseph Miller, Jr.
(74) *Attorney, Agent, or Firm* — Kilpatrick Townsend & Stockton LLP

(57) ABSTRACT

Provided is a method for forming a dielectric film in a semiconductor device, wherein the method can improve a dielectric characteristic and a leakage current characteristic. According to specific embodiments of the present invention, the method for forming a dielectric film includes: forming a zirconium dioxide ($ZrO_2$) layer over a wafer in a predetermined thickness that does not allow continuous formation of the $ZrO_2$ layer; and forming an aluminum oxide ($Al_2O_3$) layer over portions of the wafer where the $ZrO_2$ layer is not formed, in a predetermined thickness that does not allow continuous formation of the $Al_2O_3$ layer.

7 Claims, 8 Drawing Sheets

U.S. PATENT DOCUMENTS

| | | | |
|---|---|---|---|
| 6,828,218 | B2 | 12/2004 | Kim et al. |
| 6,903,398 | B2 | 6/2005 | Yamamoto |
| 2002/0014647 | A1 | 2/2002 | Seidl et al. |
| 2002/0048635 | A1 | 4/2002 | Kim et al. |
| 2002/0135048 | A1 | 9/2002 | Ahn et al. |
| 2002/0153579 | A1* | 10/2002 | Yamamoto .................. 257/412 |
| 2002/0190294 | A1 | 12/2002 | Iizuka et al. |
| 2003/0234417 | A1* | 12/2003 | Raaijmakers et al. ........ 257/309 |
| 2004/0009679 | A1 | 1/2004 | Yeo et al. |
| 2004/0104420 | A1 | 6/2004 | Coolbaugh et al. |
| 2004/0141390 | A1 | 7/2004 | Won et al. |
| 2004/0235242 | A1 | 11/2004 | Basceri et al. |
| 2005/0051824 | A1 | 3/2005 | Iizuka et al. |
| 2005/0054165 | A1 | 3/2005 | Ahn et al. |
| 2007/0223176 | A1* | 9/2007 | Kil et al. ...................... 361/313 |

FOREIGN PATENT DOCUMENTS

| | | |
|---|---|---|
| JP | 2002-314072 | 10/2002 |
| JP | 2003-188171 | 7/2003 |
| JP | 2004-214304 | 7/2004 |
| KR | 10-2000-0026002 A | 5/2000 |
| KR | 10-2001-0039874 A | 5/2001 |
| KR | 10-2003-0040530 A | 5/2003 |
| KR | 10-2004-0102092 A | 12/2004 |
| KR | 10-2005-0123428 A | 12/2005 |
| KR | 10-2006-0037895 A | 5/2006 |
| KR | 10-2006-0041355 A | 5/2006 |
| KR | 10-0596805 B1 | 6/2006 |
| KR | 10-0655139 B1 | 12/2006 |
| KR | 10-0655140 B1 | 12/2006 |
| KR | 10-0656283 B1 | 12/2006 |
| KR | 10-2007-0000707 A | 1/2007 |
| KR | 10-2007-0000759 A | 1/2007 |
| KR | 10-2007-0001677 A | 1/2007 |
| KR | 10-2007-0002579 A | 1/2007 |
| KR | 10-2007-0003031 A | 1/2007 |
| KR | 10-0672766 B1 | 1/2007 |
| KR | 10-2007-0021497 A | 2/2007 |
| KR | 10-2007-0027789 A | 3/2007 |
| KR | 10-2007-0045661 A | 5/2007 |
| KR | 10-2007-0046393 A | 5/2007 |
| KR | 10-2007-0050163 A | 5/2007 |

* cited by examiner

METHOD FOR FORMING DIELECTRIC FILM AND METHOD FOR FORMING CAPACITOR IN SEMICONDUCTOR DEVICE USING THE SAME

CROSS-REFERENCE TO RELATED APPLICATIONS

The present application is a divisional of U.S. patent application Ser. No. 11/722,680, filed on Jun. 22, 2007, which claims priority to PCT patent application number PCT/KR2005/004508, filed on Dec. 23, 2005, and Korean patent application number 10-2004-0110920, filed on Dec. 23, 2004, which are incorporated by reference in their entirety.

TECHNICAL FIELD

The present invention relates to a method for forming a dielectric film in a semiconductor device and a method for forming a capacitor using the same; and, more particularly, to a method for forming a dielectric film in a semiconductor device using an atomic layer deposition (ALD) method and a method for forming a capacitor using the same.

BACKGROUND ART

Recently, as the design rule of a dynamic random access memory (DRAM) has decreased, a cell region has decreased and an aspect ratio of a storage node in a capacitor has increased greatly. Thus, it has become difficult to secure a dielectric capacity required for each unit cell.

Conventionally, a dielectric film has been formed in oxide/nitride/oxide (ONO) layer structure to secure a dielectric capacity. However, recent researches on forming a dielectric film with an aluminum oxide ($Al_2O_3$) layer ($\in$=9), a hafnium dioxide ($HfO_2$) layer ($\in$=25), or a stacked layer of $HfO_2$/$Al_2O_3$, wherein the $Al_2O_3$ layer and the $HfO_2$ layer both have a high dielectric constant, have been actively progressed in attempts to secure a larger dielectric capacity. Also, such dielectric film is formed by employing an atomic layer deposition (ALD) method instead of the conventional chemical vapor deposition (CVD) method in order to respond to the large aspect ratio.

However, for a dielectric film formed with the stacked layer of $HfO_2$/$Al_2O_3$, a dielectric characteristic and a leakage current characteristic of the entire dielectric film depend on a corresponding dielectric constant c and a band gap energy Eg of each material. That is, the dielectric film formed with the conventional stacked layer of $HfO_2$/$Al_2O_3$ shows an electrical characteristic formed by a combination of the characteristics of each layer, as described hereinafter.

Generally, a dielectric constant $\in$ and a band gap energy Eg of the $Al_2O_3$ layer are 9 and 9 eV, respectively. On the other hand, a dielectric constant $\in$ and a band gap energy Eg of the $HfO_2$ layer are generally known to be 25 and 5.6 eV, respectively. That is, the dielectric characteristic of the entire dielectric film is affected by the $HfO_2$ layer, and the leakage current characteristic is affected by the band gap energy Eg of the $Al_2O_3$ layer. On the contrary, the leakage current characteristic of the entire dielectric film is deteriorated due to the low band gap energy Eg of the $HfO_2$ layer, and the dielectric characteristic of the entire dielectric film is deteriorated due to the low dielectric constant of the $Al_2O_3$ layer. Thus, if the dielectric film is applied in a capacitor of a DRAM device, a large limitation occurs with respect to decreasing a thickness of the dielectric film.

However, the $Al_2O_3$ layer functions to lower a crystallization temperature of the $HfO_2$ layer, which is the other layer consisting the dielectric film, and through such a function, a leakage current of the dielectric film is reduced. Therefore, in order to improve the characteristics of the dielectric film, the dielectric constant and the band gap energy of the oxide material, forming the dielectric film together with the $Al_2O_3$ layer, are generally required to be controlled.

DISCLOSURE

Technical Problem

It is, therefore, an object of the present invention to provide a method for forming a dielectric film in a semiconductor device, wherein the method can improve a dielectric characteristic and a leakage current characteristic.

Also, another object of the present invention is to provide a method for forming a capacitor in a semiconductor device using the method for forming a dielectric film.

Technical Solution

In accordance with one aspect of the present invention, there is provided a method for forming a dielectric film, including: forming a zirconium dioxide ($ZrO_2$) layer over a wafer in a predetermined thickness that does not allow continuous formation of the $ZrO_2$ layer; and forming an aluminum oxide ($Al_2O_3$) layer over portions of the wafer where the $ZrO_2$ layer is not formed, in a predetermined thickness that does not allow continuous formation of the $Al_2O_3$ layer.

In accordance with another aspect of the present invention, there is provided a method for forming a dielectric film, including: forming an $Al_2O_3$ layer over a wafer in a predetermined thickness that does not allow continuous formation of the $Al_2O_3$ layer; and forming a $ZrO_2$ layer over portions of the wafer where the $Al_2O_3$ layer is not formed, in a predetermined thickness that does not allow continuous formation of the $ZrO_2$ layer.

In accordance with still another aspect of the present invention, there is provided a method for forming a dielectric film, including forming a $[ZrO_2]x[Al_2O_3]y$ layer, where $ZrO_2$ and $Al_2O_3$ are mixed, x and y each representing 0 or a positive number, over a wafer using a source gas where a Zr atom and an Al atom are formed as one molecule.

In accordance with a further aspect of the present invention, there is provided a method for forming a capacitor, including:

preparing a substrate structure on which a contact plug is formed; forming a patterned insulation layer over the substrate in a manner to expose the contact plug; forming a bottom electrode over the patterned insulation layer and the substrate structure; forming a dielectric film over the bottom electrode using any suitable method as disclosed herein; and forming an upper electrode over the dielectric film.

Advantageous Effects

In accordance with specific embodiments of the present invention, a dielectric characteristic and a leakage current characteristic of a capacitor used in a semiconductor device can be improved by forming a dielectric film using a $[ZrO_2]x[Al_2O_3]y$ layer, where x and y each represents 0 or a positive number. Herein, $ZrO_2$ and $Al_2O_3$ are evenly mixed in the $[ZrO_2]x[Al_2O_3]y$ layer.

DESCRIPTION OF DRAWINGS

The above and other objects and features of the present invention will become apparent from the following description of the exemplary embodiments given in conjunction with the accompanying drawings, in which.

BEST MODE FOR THE INVENTION

Other objects and aspects of the invention will become apparent from the following description of the embodiments with reference to the accompanying drawings, which is set forth hereinafter.

First Embodiment

Figure 1:
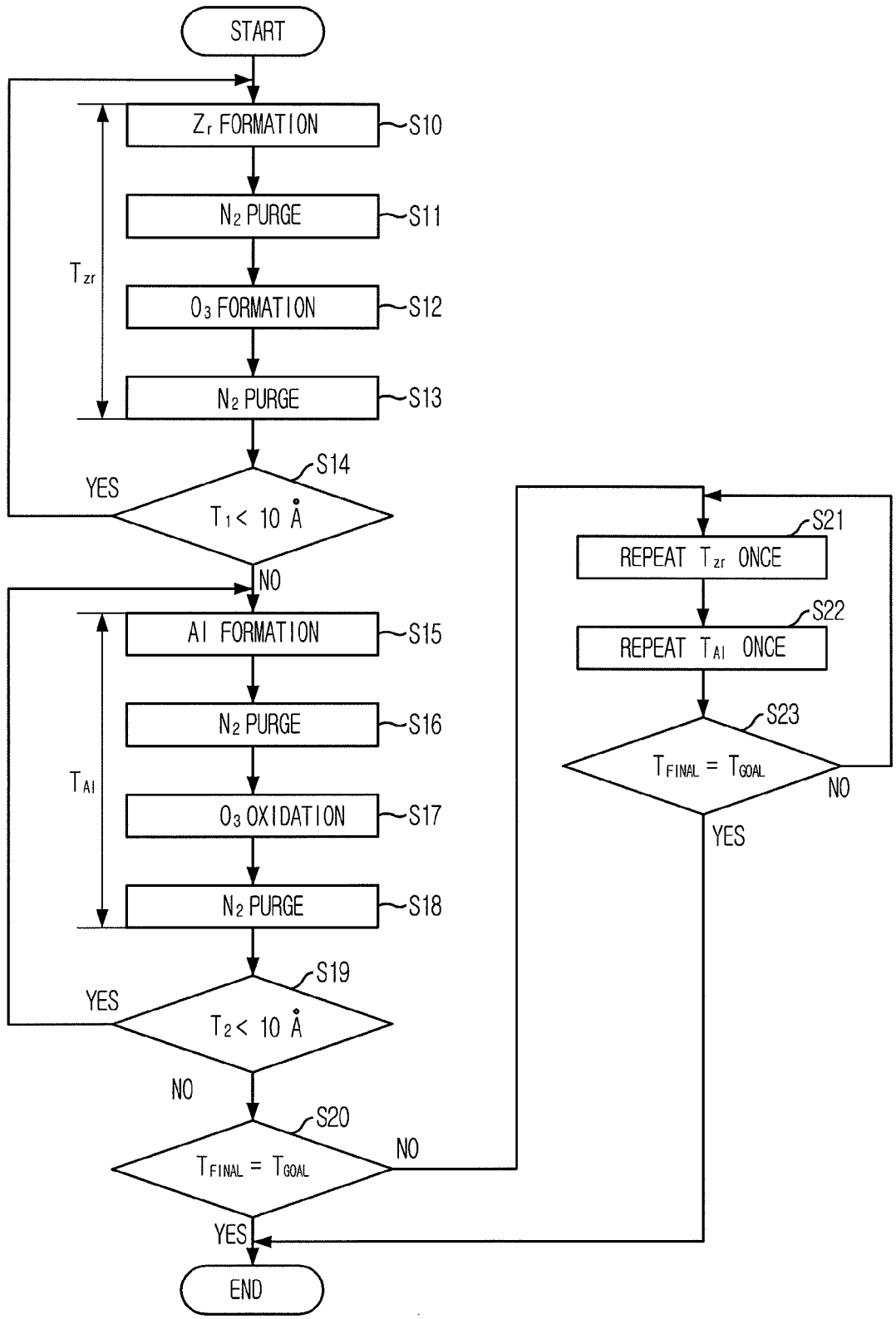
FIG. 1 is a flowchart illustrating a method for forming a dielectric film in accordance with a first embodiment of the present invention.
Figure 2:
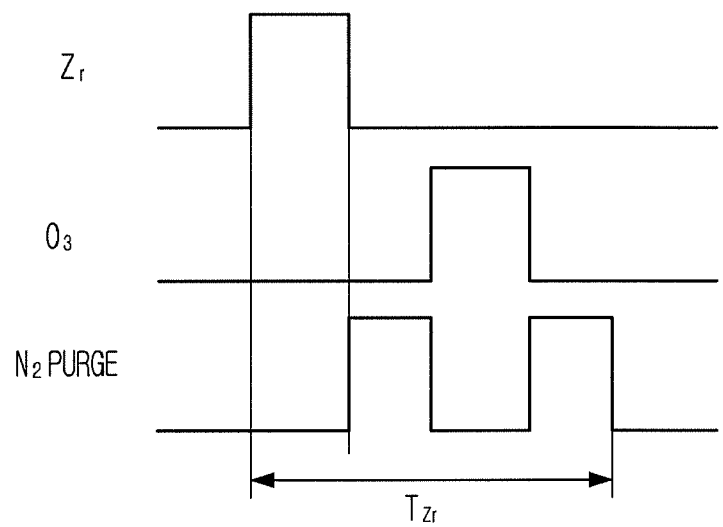
FIG. 2 is a diagram illustrating a process of forming a zirconium dioxide ($ZrO_2$) layer illustrated in FIG. 1.
Figure 3:
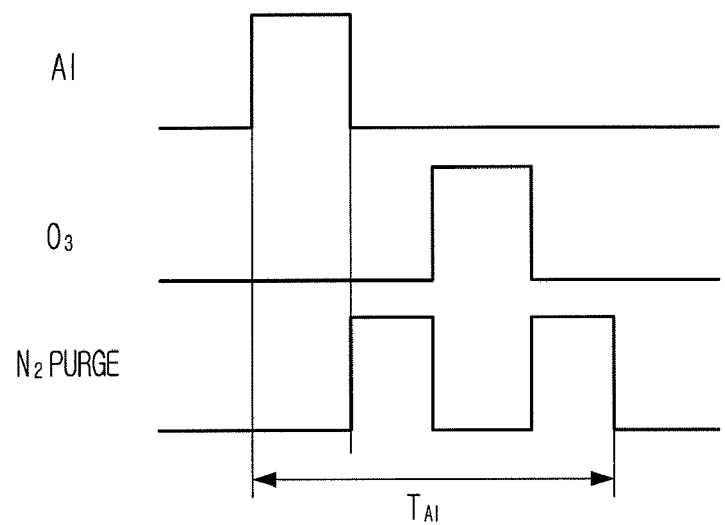
FIG. 3 is a diagram illustrating a process of forming an aluminum oxide ($Al_2O_3$) layer illustrated in FIG. 1.

FIG. 1 is a process flowchart illustrated to describe a method for forming a dielectric film in a semiconductor device in accordance with a first embodiment of the present invention, FIG. 2 is a diagram illustrated to describe a sequential order of a zirconium dioxide ($ZrO_2$) layer formation process, and FIG. 3 is a diagram illustrated to describe a sequential order of an aluminum oxide ($Al_2O_3$) layer formation process.

Referring to FIGS. 1 to 3, the method for forming a dielectric film in a semiconductor device in accordance with the first embodiment of the present invention includes forming a $ZrO_2$ layer and then forming an $Al_2O_3$ layer, using an atomic layer deposition (ALD) method.

Figure 4A:
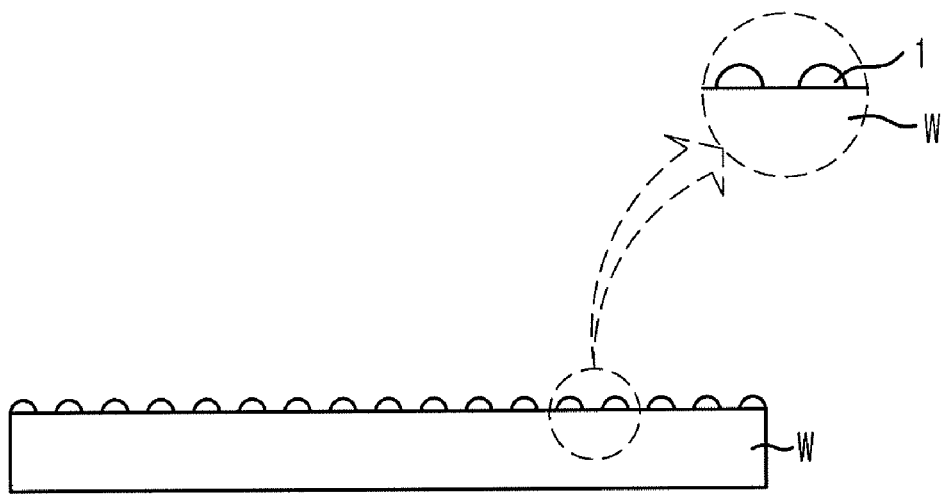
FIGS. 4A and 4B show diagrams illustrating a dielectric film formed through the method described in FIG. 1.

The formation process of the $ZrO_2$ layer is as follows. One source gas selected from the group consisting of $Zr(O-tBu)_4$, $Zr[N(CH_3)_2]_4$, $Zr[N(C_2H_5)(CH_3)]_4$, $Zr[N(C_2H_5)_2]_4$, $Zr(TMHD)_4$, $Zr(OiC_3H_7)_3(TMTD)$, and $Zr(OtBu)_4$, is supplied inside a chamber of an ALD apparatus to adsorb zirconium (Zr) over a wafer, although not illustrated, at step S10. Herein, a temperature ranging from approximately 200° C. to approximately 350° C. is maintained inside the chamber. Subsequently, nitrogen ($N_2$) gas is supplied inside the chamber to purge the remaining Zr source gas, which did not become adsorbed, out of the chamber at step S11. Next, $O_3$ is supplied inside the chamber to oxidize the adsorbed Zr over the wafer to thereby form a $ZrO_2$ layer at step S12. Then, $N_2$ gas is supplied inside the chamber to purge any non-reacted $O_3$ at step S13. The steps S10 to S13 are performed as one cycle $T_{Zr}$, and the cycle $T_{Zr}$ is repeatedly performed until a thickness $T_1$ of the $ZrO_2$ layer reaches approximately 10 Å. Herein, the reason for limiting the thickness $T_1$ of the $ZrO_2$ layer to approximately 10 Å is to form the $ZrO_2$ layer over the wafer W non-continuously as illustrated in FIG. 4A. During one cycle $T_{Zr}$, the thickness $T_1$ of the $ZrO_2$ layer reaches less than approximately 1 Å. Therefore, the $ZrO_2$ layer can be formed in a thickness nearing approximately 10 Å by repeating the cycle $T_{Zr}$ approximately 10 times.

Figure 4B:
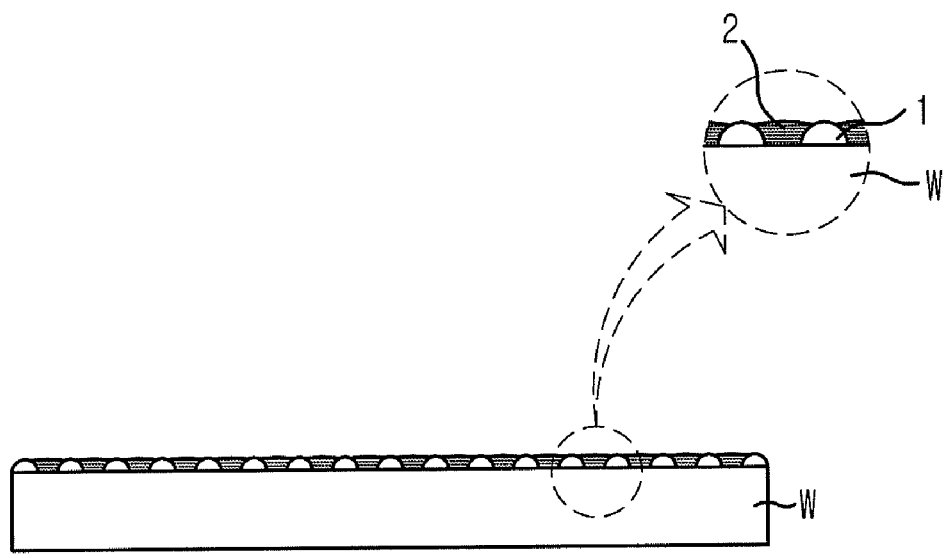

Subsequently, an $Al_2O_3$ layer formation is performed. The $Al_2O_3$ layer formation is as follows. An $Al(CH_3)_3$ source gas is supplied inside the chamber to adsorb Al on the wafer in-situ at step S15. Subsequently, $N_2$ gas is supplied inside the chamber to purge the remaining Al source gas, which did not become adsorbed, out of the chamber at step S16. Next, $O_3$ is supplied inside the chamber to form an $Al_2O_3$ layer over portions of the wafer where the $ZrO_2$ layer is not formed, at step S17. As described above, when the thickness $T_1$ of the $ZrO_2$ layer is limited to less than approximately 10 Å (i.e., approximately 1 Å to approximately 10 Å), the $ZrO_2$ layer is non-continuously formed over the wafer W, as illustrated in FIG. 4B. Thus, the $Al_2O_3$ layer 2 is formed over the portions of the wafer where the $ZrO_2$ layer 1 is not formed, that is, between the $ZrO_2$ layers 1. Subsequently, $N_2$ gas is supplied inside the chamber to purge any non-reacted $O_3$ at step S18. The steps S15 to S18 are performed as one cycle $T_{A1}$ and the cycle $T_{A1}$ is repeatedly performed until a thickness $T_2$ of the $Al_2O_3$ layer reaches less than approximately 10 Å. During one cycle $T_{A1}$ the thickness $T_2$ of the $Al_2O_3$ layer reaches less than approximately 1 Å. Therefore, the $Al_2O_3$ layer can be formed in a thickness nearing approximately 10 Å by repeating the cycle $T_{A1}$ approximately 10 times.

Furthermore, if a thickness $T_{final}$ of a mixed layer including the $ZrO_2$ layer and the $Al_2O_3$ layer is smaller than a goal thickness $T_{goal}$, then, the $ZrO_2$ layer formation cycle $T_{Zr}$ and the $Al_2O_3$ layer formation cycle $T_{A1}$ are each repeatedly performed once at a time at steps S21 and S22. The steps S21 and S22 are repeatedly performed until the thickness $T_{final}$ becomes substantially identical to the goal thickness $T_{goal}$. Herein, the thickness $T_{final}$ of the mixed layer including the $ZrO_2$ layer and the $Al_2O_3$ layer can be formed to range from approximately 30 Å to approximately 500 Å.

Through the above processes, the dielectric film is formed by employing $[ZrO_2]x[Al_2O_3]y$, where x and y each represents 0 or a positive number.

Second Embodiment

Figure 5:
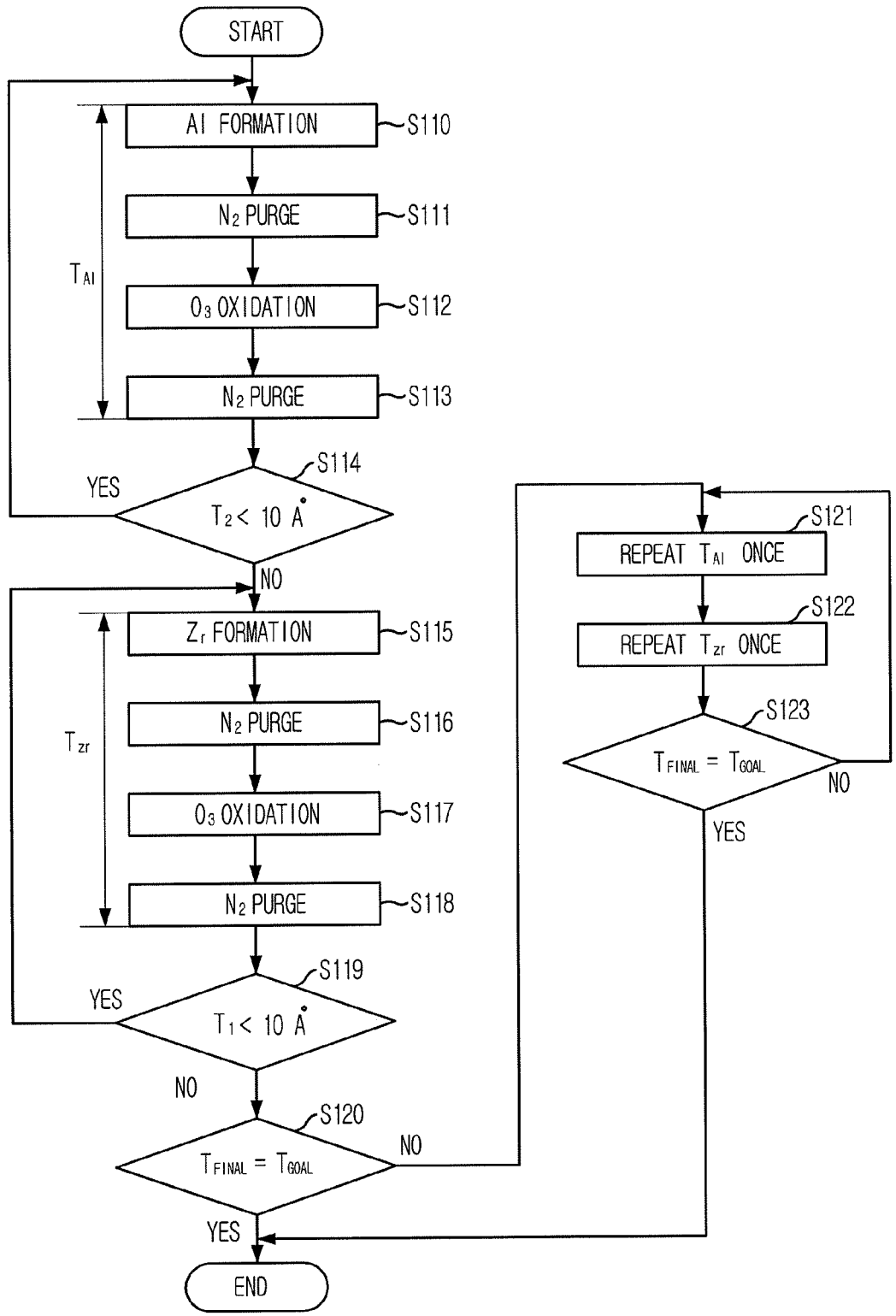
FIG. 5 is a flowchart illustrating a method for forming a dielectric film in accordance with a second embodiment of the present invention.

FIG. 5 is a flowchart illustrating a method for forming a dielectric film in accordance with a second embodiment of the present invention.

As shown in FIG. 5, the method for forming a dielectric film in accordance with the second embodiment of the present invention uses an ALD method like the first embodiment of the present invention. However, in the second embodiment, an $Al_2O_3$ layer is non-continuously formed over a wafer and then a $ZrO_2$ layer is formed, instead of forming the $ZrO_2$ layer first. Excluding such a difference, the second embodiment of the present invention is performed with substantially identical processes to the first embodiment of the present invention. Thus, detailed descriptions of the second embodiment are abridged herein for the convenience of description.

Third Embodiment

Figure 6:
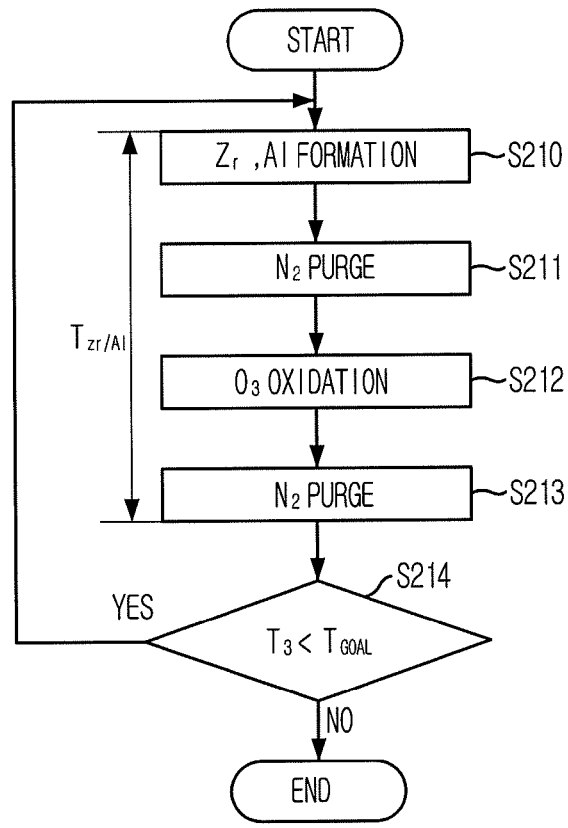
FIG. 6 is a flowchart illustrating a method for forming a dielectric film in accordance with a third embodiment of the present invention.
Figure 7:
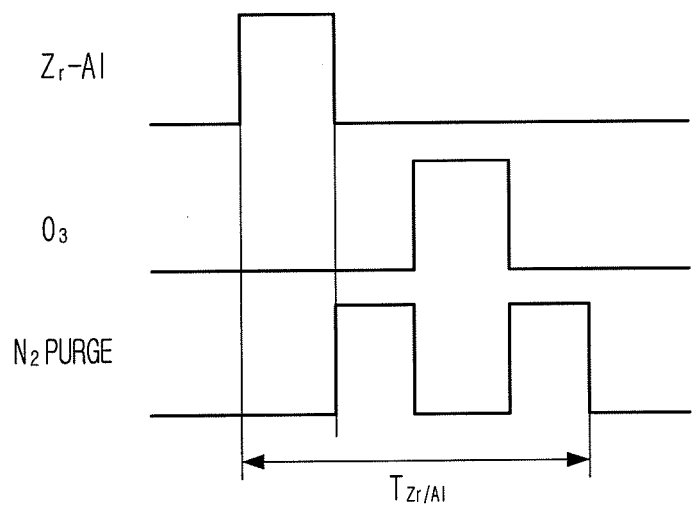
FIG. 7 is a diagram illustrating a process of forming a $[ZrO_2]x[Al_2O_3]y$ layer illustrated in FIG. 6.

FIG. 6 is a flowchart illustrating a method for forming a dielectric film in accordance with a third embodiment of the present invention, and FIG. 7 is a diagram illustrating a formation process of simultaneously forming a $[ZrO_2]x[Al_2O_3]y$ layer.

Referring to FIGS. 6 and 7, the method for forming a dielectric film in a semiconductor device in accordance with the third embodiment of the present invention uses an ALD method to simultaneously form the $[ZrO_2]x[Al_2O_3]y$ layer.

A source gas such as ZrAl (MMP)$_2$(OiPr)$_5$, where Zr and Al are formed as one molecule, is supplied inside a chamber of an ALD apparatus to adsorb Zr and Al over a wafer, although it is not shown, at step S210. Herein, a temperature ranging from approximately 200° C. to approximately 350° C. is maintained inside the chamber. Subsequently, N$_2$ gas is supplied inside the chamber to purge the remaining source gas, which did not become adsorbed, out of the chamber at step S211. Next, O$_3$ is supplied inside the chamber to oxidize the Zr and Al adsorbed over the wafer to thereby form the [ZrO$_2$]x[Al$_2$O$_3$]y layer at step S212. Herein, the sum of x and y may be less than approximately 10.

Then, N$_2$ gas is supplied inside the chamber to purge any non-reacted O$_3$ at step S213. The steps S210 to S213 are performed as one cycle T$_{Zr/Al}$. If a thickness T$_3$ of the [ZrO$_2$]x[Al$_2$O$_3$]y layer is smaller than a goal thickness T$_{goal}$ then, the cycle T$_{Zr/Al}$ (S210 to S213) is repeatedly performed until the thickness T$_3$ of the [ZrO$_2$]x[Al$_2$O$_3$]y layer becomes substantially identical to the goal thickness T$_{goal}$. Herein, the thickness T$_3$ of the [ZrO$_2$]x[Al$_2$O$_3$]y layer may be formed within a range of approximately 30 Å and approximately 500 Å.

On the other hand, although the first to third embodiments of the present invention use O$_3$ for the oxidation process, O$_3$ is one example, and H$_2$O or oxygen plasma can be used instead of O$_3$. Also, the purge process in the first to third embodiments of the present invention use N$_2$ gas, N$_2$ is also an example, and the purge process can be performed by employing a vacuum pump or argon (Ar) gas.

Meanwhile, Tables 1 and 2 below are comparative tables to compare properties of HfO$_2$ and ZrO$_2$.

TABLE 1

| Material | Dielectric constant ($\epsilon$) | Band gap energy Eg(eV) | $\Delta$Ec(eV) to Si | Crystal structure(s) |
| --- | --- | --- | --- | --- |
| SiO$_2$ | 3.9 | 8.9 | 3.2 | Amorphous |
| Si$_3$N$_4$ | 7 | 5.1 | 2 | Amorphous |
| Al$_2$O$_3$ | 9 | 8.7 | 2.8$^a$ | Amorphous |
| Y$_2$O$_3$ | 15 | 5.6 | 2.3$^a$ | Cubical |
| La$_2$O$_3$ | 30 | 4.3 | 2.3$^a$ | Hexagonal, Cubical |
| Ta$_2$O$_5$ | 26 | 4.5 | 1-1.5 | Orthorhombic |
| TiO$_2$ | 80 | 3.5 | 1.2 | Tetragonal$^a$ (rutile, anatase) |
| HfO$_2$ | 25 | 5.7 | 1.5$^a$ | Monoclinic$^b$, Tetragonal$^c$, Cubical |
| ZrO$_2$ | 25 | 7.8 | 1.4$^a$ | Monoclinic$^b$, Tetragonal$^c$, Cubical |

TABLE 2

| Element | Name | Molecular weight (g/mol) | Temp (1 Torr) | Source decomposition temperature (° C.) |
| --- | --- | --- | --- | --- |
| Hf | Hf[N(C$_2$H$_5$)$_2$]$_4$ | 466.49 | 126 | 150 |
|  | Hf[N(CH$_3$)$_2$]$_4$ | 354.49 | 75 | 90 |
|  | Hf[N(C$_2$H$_5$)(CH$_3$)]$_4$ | 410.49 | 113 | 140 |
| Zr | Zr[N(C$_2$H$_5$)$_2$]$_4$ | 379.74 | 108 | 140 |
|  | Zr[N(CH$_3$)$_2$]$_4$ | 267.22 | 77 | 80 |
|  | Zr[N(C$_2$H$_5$)(CH$_3$)]$_4$ | 323.22 | 106 | 130 |

As shown in Table 1 above, ZrO$_2$ has a dielectric constant similar to HfO$_2$, however, ZrO$_2$ has band gap energy relatively larger than HfO$_2$. That is, by using Al$_2$O$_3$—ZrO$_2$ in stacked or mixed layer structure, band gap energy of an entire thin film is increased, improving a leakage current characteristic of a dielectric film. Thus, it becomes easy to reduce the thickness of a dielectric film. Furthermore, if ZrO$_2$ is applied instead of HfO$_2$, it is more advantageous to apply the dielectric film in processes for a mass production because a Zr source, which can be used commercially, has a large advantage of easy handling due to extremely smaller saturation vapor pressure and molecular weight when compared to an Hf source.

Figure 8:
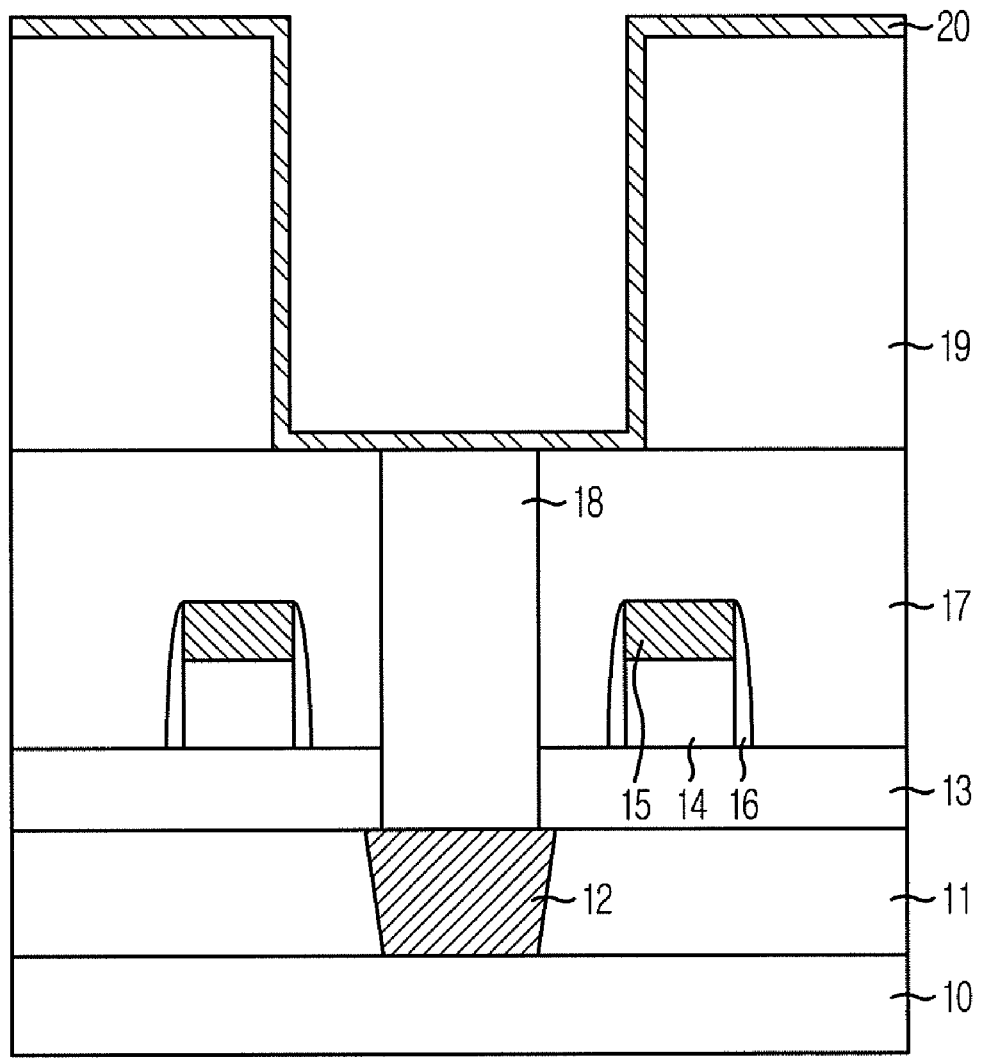
FIGS. 8 to 10 are cross-sectional views illustrating a method for forming a capacitor in accordance with a specific embodiment of the present invention.
Figure 9:
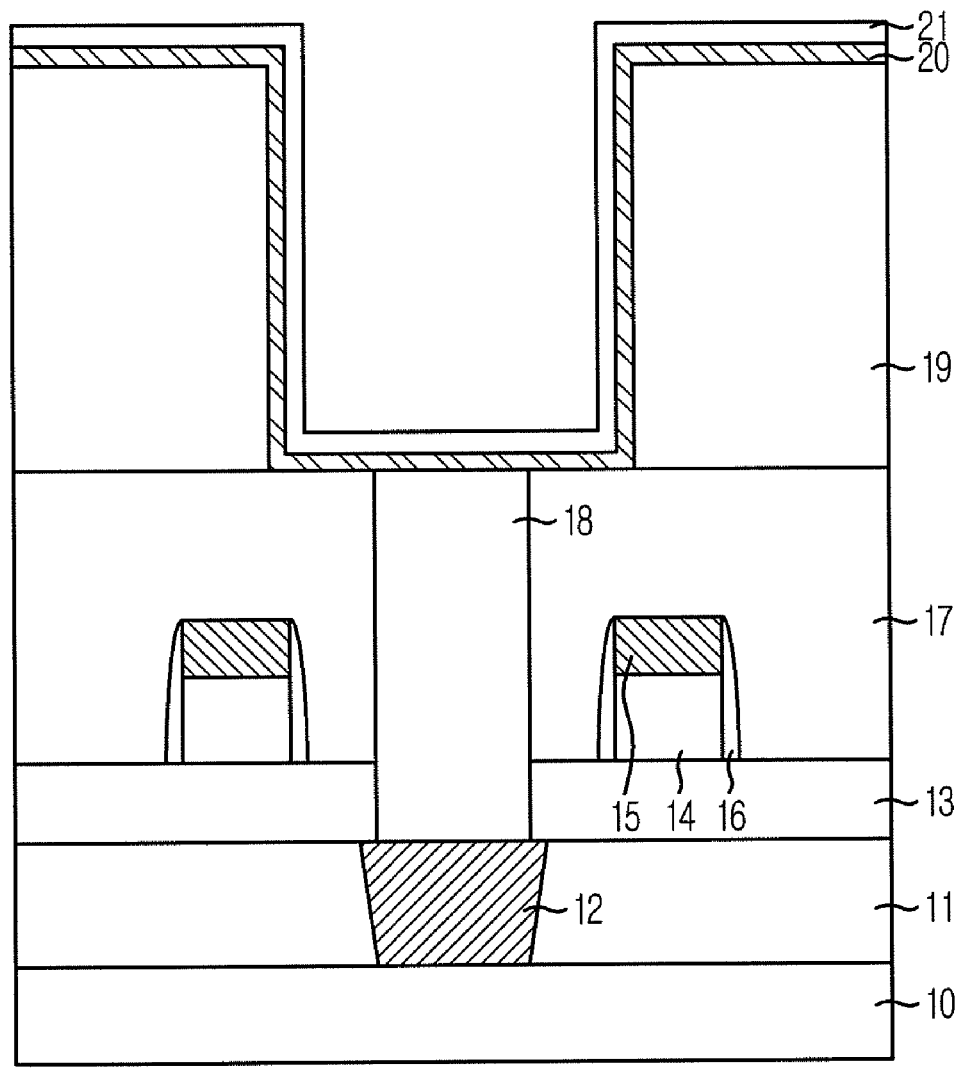
Figure 10:
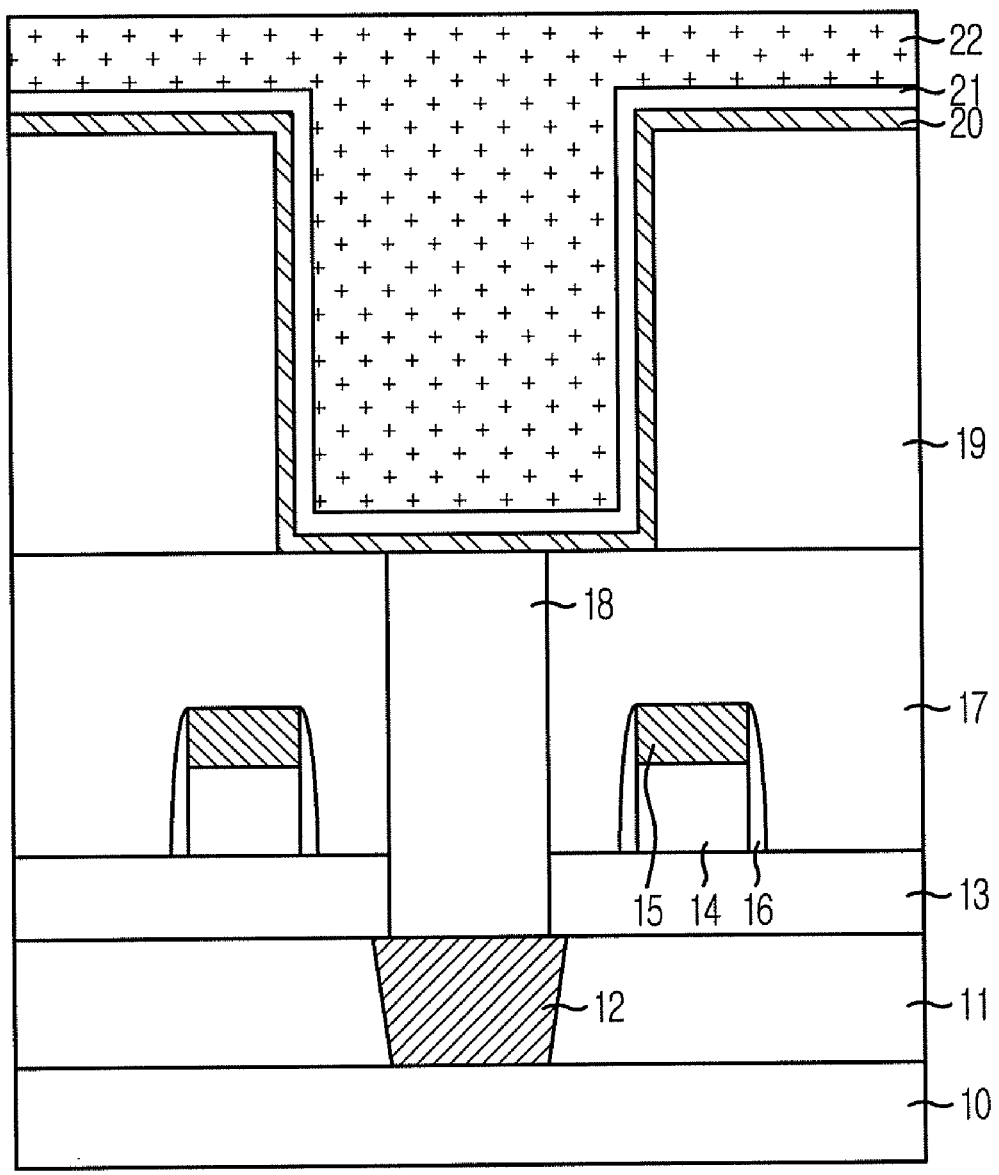

Hereinafter, a method for forming a capacitor is described referring to FIGS. 8 to 10, using the method for forming a dielectric film in the first to third embodiments of the present invention. FIGS. 8 to 10 are cross-sectional views illustrating a method for forming a concave type capacitor in a dynamic random access memory (DRAM) device.

Referring to FIG. 8, a substrate 10, over which bottom layers including a storage node contact plug 18 are formed, is provided. Herein, the bottom layers 10 further include: a conductive layer 12; first to third inter-layer insulation layers 11, 13 and 17; bit lines 14; hard masks 15; and spacers 16. Herein, the conductive layer 12 is formed by employing polysilicon, and the first to third inter-layer insulation layers 11, 13 and 17 are each formed by employing an oxide-based material. Also, the bit lines 14 are formed by employing polysilicon (or titanium nitride (TiN)) and tungsten (or tungsten silicide), and the hard masks 15 are formed by employing a nitride-based material.

Subsequently, an insulation layer 19 for use in a storage node pattern is formed over the above resulting substrate structure, exposing a top portion of the storage node contact plug 18. Herein, the insulation layer 19 is formed by employing an oxide-based material or polysilicon.

Furthermore, a storage node 20 is formed over the above entire resultant structure. Herein, the storage node 20 is a bottom electrode of the capacitor, and is formed by employing one selected from the group consisting of polysilicon doped with impurities such as phosphorus (P) and arsenic (As), TiN, ruthenium (Ru), ruthenium dioxide (RuO$_2$), platinum (Pt), iridium (Ir), and iridium dioxide (IrO$_2$).

Moreover, as shown in FIG. 9, a dielectric film 21 is formed over the storage node 20. Herein, the dielectric film 21 is formed by employing [ZrO$_2$]x[Al$_2$O$_3$]y, where ZrO$_2$ and Al$_2$O$_3$ are evenly mixed, through employing one of the first to the third embodiments of the present invention. Herein, x and y each represents 0 or a positive number. For reference, the sum of x and y may be kept below approximately 10.

Next, a thermal treatment process is performed to the dielectric film 21. Herein, the thermal treatment process is performed by employing one selected from the group consisting of a furnace method, a rapid temperature process (RTP), and a rapid temperature anneal (RTA) method. Herein, the thermal treatment process is performed in an atmosphere including a small amount of Ar, N$_2$ or oxygen (O$_2$) at a temperature ranging from approximately 450° C. to 850° C.

Subsequently, as shown in FIG. 10, an upper electrode 22 is formed over the dielectric film 21. Herein, the upper electrode 22 is formed by employing a material substantially identical to the storage node 20. For example, the upper electrode 22 is formed by employing one selected from the group consisting of polysilicon doped with impurities such as P and As, TiN, Ru, RuO$_2$, Pt, Ir, and IrO$_2$.

The specific embodiments of the present invention only describe the embodiments applied to a capacitor in concave structure. However, the capacitor in concave structure is one example, and the present embodiments can be also applied to capacitors in flat and cylinder structure. Also, the embodiments can be applied as a dielectric film of a capacitor in a radio frequency (RF) device. Furthermore, the embodiments can be applied to a dielectric film interposed between a floating gate and a control gate in a memory device including a flash memory, an electrically erasable programmable read only memory (EEPROM), and an erasable programmable read only memory (EPROM).

The present application contains subject matter related to Korean patent application No. 2004-0110920, filed in the Korean Intellectual Property Office on Dec. 23, 2004, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A method for forming a dielectric film, comprising forming a $[ZrO_2]x[Al_2O_3]y$ layer, where $ZrO_2$ and $Al_2O_3$ are mixed, x and y each representing a positive number, in a semiconductor device by using a source gas that includes $ZrAl(MMP)_2(OiPr)_5$.

2. The method as recited in claim 1, wherein the forming of the $[ZrO_2]x[Al_2O_3]y$ layer includes having the sum of x and y less than approximately 10.

3. The method as recited in claim 1, wherein the $[ZrO_2]x[Al_2O_3]y$ layer is formed to have a thickness ranging from approximately 30 Å to approximately 500 Å.

4. The method as recited in claim 1, wherein the forming of the $[ZrO_2]x[Al_2O_3]y$ layer includes:
supplying the source gas to inside a chamber of an ALD apparatus to adsorb the source gas on a surface of the semiconductor device;
purging the source gas which did not become adsorbed from the chamber by at least one of supplying an inert gas inside the chamber or using a vacuum pump;
supplying an oxidation gas inside the chamber to oxidize the adsorbed source gas to form the $[ZrO_2]x[Al_2O_3]y$ layer; and
purging any non-reacted oxidation gas from the chamber by at least one of supplying an inert gas inside the chamber or using a vacuum pump.

5. A method for forming a capacitor, comprising:
preparing a substrate structure on which a contact plug is formed;
forming a patterned insulation layer over the substrate structure in a manner to expose the contact plug;
forming a bottom electrode over the patterned insulation layer and the substrate structure;
forming a dielectric film over the bottom electrode using a method claimed in any one of claim 1, claim 2, claim 3, and claim 4; and
forming an upper electrode over the dielectric film.

6. The method as recited in claim 5, further comprising performing a thermal treatment process to the dielectric film after the dielectric film is formed, wherein the thermal treatment process is performed in an atmosphere of Ar, $N_2$ or oxygen ($O_2$) at a temperature ranging from approximately 450° C. to approximately 850° C.

7. The method as recited in claim 4, wherein a temperature ranging from approximately 200° C. to approximately 350° C. is maintained in the chamber of the ALD apparatus when the source gas is adsorbed on the surface of the semiconductor device.

* * * * *